United States Patent [19]
Dolbear

[11] Patent Number: 5,926,371
[45] Date of Patent: Jul. 20, 1999

[54] HEAT TRANSFER APPARATUS WHICH ACCOMMODATES ELEVATIONAL DISPARITY ACROSS AN UPPER SURFACE OF A SURFACE-MOUNTED SEMICONDUCTOR DEVICE

[75] Inventor: Thomas P. Dolbear, Austin, Tex.

[73] Assignee: Advanced Micro Devices, Inc., Houston, Tex.

[21] Appl. No.: 08/846,001

[22] Filed: Apr. 25, 1997

[51] Int. Cl.⁶ .................................................. H05K 7/20
[52] U.S. Cl. ..................... 361/704; 174/16.3; 174/138 G; 257/713; 257/718; 361/715; 361/719
[58] Field of Search ................................. 165/80.2, 80.3, 165/185; 174/16.3, 138 G; 257/704, 706–707, 710, 712–713, 717–719, 726–727, 732; 361/704–710, 715–722, 742

[56] References Cited

U.S. PATENT DOCUMENTS 5,473,510  12/1995  Dozier, II ................................. 361/719

OTHER PUBLICATIONS

Johnson, "Integrated Circuit Semiconductor Devie Package Structure", IBM Tech Disl. Bulletin, vol. 19, No. 9, Feb. 1977, pp. 3387–3388.

*Primary Examiner*—Gregory Thompson
*Attorney, Agent, or Firm*—Kevin L. Daffer; Conley, Rose & Tayon

[57] ABSTRACT

A heat transfer apparatus is presented accommodating elevational disparity of an upper surface of a semiconductor device with respect to the component side of a PCB without adversely affecting system reliability. The heat transfer apparatus includes a thermally conductive cap structure positioned between the semiconductor device and an ambient and thermally coupled to the semiconductor device. One embodiment includes one or more spacers which maintain a space between the cap structure and the semiconductor device. A chip mounted to the substrate of a ceramic BGA package is mechanically isolated from the cap structure by the spacers, preventing chip damage due to shock and vibration. A backing plate on a side of the PCB opposite the semiconductor device provides PCB structural support and additional heat transfer. Several fasteners attach the backing plate to the cap structure. A portion of the fasteners exert a force which urges the cap structure toward the semiconductor device, while the remainder of the fasteners fix the relative positions of the backing plate and the cap structure. Fixing the relative positions of the backing plate and the cap structure reduces creep problems and promotes stress relief in viscoplastic elements. A first thermal interface layer between the cap structure and the semiconductor device achieves an acceptably low thermal resistance value under a relatively small amount of pressure. The spacers are omitted in an alternate embodiment wherein the first thermal interface layer has a uniform thickness and a consistency which permits the thickness to be maintained during installation.

34 Claims, 3 Drawing Sheets

HEAT TRANSFER APPARATUS WHICH ACCOMMODATES ELEVATIONAL DISPARITY ACROSS AN UPPER SURFACE OF A SURFACE-MOUNTED SEMICONDUCTOR DEVICE

BACKGROUND OF THE INVENTION

1. Field of the Invention

This invention relates to the manufacture of electronic systems, and more particularly to devices used to transfer heat energy produced by a semiconductor device to an ambient.

2. Description of the Relevant Art

During manufacture of an integrated circuit (e.g., a microprocessor), signal lines formed upon the silicon substrate which are to be connected to external devices are terminated at flat metal contact regions called input/output (I/O) pads. Following manufacture, the integrated circuit is typically secured within a protective semiconductor device package. Each I/O pad of the chip is then connected to one or more terminals of the device package. The terminals of a device packages are typically arranged about the periphery of the package. Fine metal wires are typically used to connect the I/O pads of the chip to the terminals of the device package. Some types of device packages have terminals called "pins" for insertion into holes in a printed circuit board (PCB). Other types of device packages have terminals called "leads" for attachment to flat metal contact regions on an exposed surface of a PCB.

As integrated circuit fabrication technology improves, manufacturers are able to integrate more and more functions onto single silicon substrates. As the number of functions on a single chip increases, however, the number of signal lines which need to be connected to external devices also increases. The corresponding numbers of required I/O pads and device package terminals increase as well, as do the complexities and costs of the device packages. Constraints of high-volume PCB assembly operations place lower limits on the physical dimensions of and distances between device package terminals. As a result, the areas of peripheral-terminal device packages having hundreds of terminals are largely proportional to the number of terminals. These larger packages with fine-pitch leads are subject to mechanical damage during handling or testing. Mishandling can result in a loss of lead coplanarity, adversely affecting PCB assembly yields. In addition, the lengths of signal lines from chip I/O pads to device package terminals increase with the number of terminals, and the high-frequency electrical performance of larger peripheral-terminal device packages suffer as a result.

Grid array semiconductor device packages, on the other hand, have terminals arranged as an array across the underside surface of the device package. As a result, the physical dimensions of grid array device packages having hundreds of terminals are much smaller than their peripheral-terminal counterparts. Such smaller packages are highly desirable in portable device applications such as laptop and palmtop computers and hand-held communications devices such as cellular telephones. In addition, the lengths of signal lines from chip I/O pads to device package terminals are shorter, thus the high-frequency electrical performances of grid array device packages are typically better than those of corresponding peripheral-terminal device packages. Grid array device packages also allow the continued use of existing PCB assembly equipment developed for peripheral-terminal devices.

An increasingly popular type of grid array device package is the ball grid array (BGA) device package. A BGA device includes a chip mounted upon a larger substrate made of, for example, fiberglass-epoxy printed circuit board material or a ceramic material (e.g., aluminum oxide, alumina, $Al_2O_3$, or aluminum nitride, AlN). The substrate includes two sets of bonding pads: a first set adjacent to the chip and a second set arranged as an array across the underside surface of the device package. Members of the second set of bonding pads function as device package terminals, and are coated with solder. The resulting solder "balls" on the underside of the BGA device package allow the device to be surface mounted to an ordinary PCB. The I/O pads of the chip are connected to corresponding members of the first set of bonding pads by signal lines (e.g., fine metal wires). The substrate includes one or more layers of signal lines (i.e., interconnects) which connect respective members of the first and second sets of bonding pads.

During PCB assembly, the solder-covered bonding pads of a BGA device package are placed in physical contact with corresponding bonding pads of a PCB. In some cases, the solder-covered bonding pads of the BGA device package are then heated long enough for the solder to flow. In other cases, the bonding pads of the PCB are coated with solder which melts at a lower temperature than that of the solder balls, and the bonding pads of the PCB are heated long enough for the solder thereupon to flow. In either case, when the solder cools, the bonding pads on the underside of the BGA device package are electrically and mechanically coupled to the corresponding bonding pads of the PCB.

Semiconductor devices (e.g., integrated circuits) dissipate electrical power during operation, transforming electrical energy into heat energy. At the same time, several key operating parameters of a semiconductor device typically vary with temperature, and reliable device operation within specifications occurs only within a defined operating temperature range. For high performance devices, such as microprocessors, specified performance is only achieved when the temperature of the device is below a specified maximum operating temperature. Operation of the device at a temperature above an upper limit of the operating temperature range, or above the maximum operating temperature, may result in irreversible damage to the device. In addition, it has been established that the reliability of a semiconductor device decreases with increasing operating temperature. The heat energy produced by a semiconductor device during operation must thus be removed to the ambient environment at a rate which ensures operational and reliability requirements are met. Some of the heat energy produced by an integrated circuit device flows from I/O pads to the PCB through the signal lines within the device package and the device package terminals.

The operating temperature of a chip enclosed within a device package is governed by: (i) the temperature of the ambient surrounding the device package, (ii) the amount of electrical power dissipated by the chip, and (iii) the sum of thermal resistances of elements and interfaces along the a heat transfer path from the chip to the ambient:

$T_J = T_A + P_D \cdot \theta_{JA}$, where $T_J$=average junction (i.e., chip) temperature (° C.),
$T_A$=ambient temperature (° C.),
$P_D$=chip power dissipation (W), and
$\theta_{JA}$=sum of thermal resistances of elements and interfaces along the heat transfer path from the chip to the ambient (° C/W)

Proper thermal design of an electronic system involves influencing the values of $\theta_{JA}$ for each integrated circuit device such that the average temperature of the chip, $T_J$, does not exceed a maximum value, $T_{J(MAX)}$. $T_{J(MAX)}$ is specified by the device manufacturer to meet operational and reliability requirements as described above.

For example, in the case of an integrated circuit device relying on direct exposure to the ambient (i.e., natural convection) for cooling, most of the heat energy produced by the chip must flow through the device package (by conduction) and through the interface between the surface of the device package and the ambient (principally by convection) to reach the ambient. The value of $\theta_{JA}$ is given by:

$$\theta_{JA} = \theta_{JC} + \theta_{CA}$$

where $\theta_{JC}$ is the thermal resistance of the device package (i.e., the junction-to-case thermal resistance value) and $\theta_{CA}$ is the thermal resistance of the interface between the surface of the device package and the ambient (i.e., the case-to-ambient thermal resistance value). Integrated circuit device manufacturers typically specify conservative values of $\theta_{JC}$ and $\theta_{CA}$ for their products. In order to keep the temperature of the chip below $T_{J(MAX)}$, the maximum power which may safely be dissipated by the device is dependent upon the temperature of the ambient.

More complex heat transfer (i.e., cooling) mechanisms, such as heat sinks and forced air cooling, permit semiconductor devices to dissipate more electrical power than direct exposure to the ambient would otherwise allow. For example, consider an integrated circuit employing a heat sink attached to one or more external surfaces of the device package for increased heat transfer capability. Most of the heat energy produced by the chip must flow through the device package (by conduction), through the interface between adjoining surfaces of the device package and the heat sink (by conduction) and through the interface between the heat sink and the ambient (principally by convection) to reach the ambient. The value of $\theta_{JA}$ is given by:

$$\theta_{JA} = \theta_{JC} + \theta_{CS} + \theta_{SA}$$

where $\theta_{JC}$ is the junction-to-case thermal resistance value, $\theta_{CS}$ is the thermal resistance of the interface between the adjoining surfaces of the device package and the heat sink (i.e., the case-to-sink thermal resistance value), and $\theta_{SA}$ is the thermal resistance of the interface between the surface of the heat sink and the ambient (i.e., the sink-to-ambient thermal resistance value). Heat sink manufacturers typically specify conservative values of $\theta_{CS}$ and $\theta_{SA}$ for various means of coupling their products to standard device packages. The sum of $\theta_{CS}$ and $\theta_{SA}$ is typically less than $\theta_{CA}$ (for the device package in natural convection and without a heat sink), permitting the integrated circuit device to dissipate more electrical power than direct exposure to the ambient would otherwise allow while keeping the temperature of the chip below $T_{J(MAX)}$.

The mating surfaces of device packages and heat sinks are not perfectly flat or smooth, consisting of microscopic peaks and valleys. When the mating surfaces of a device package and a heat sink are brought into direct contact, air gaps exist over a large fraction of the total mating surface area. These air gaps contribute little to the conduction of heat from the device package to the heat sink. The value of $\theta_{CS}$ is typically lowered substantially by filling the air gaps with a thermal interface material which conducts heat more readily than air. Common thermal interface materials include thermal greases and elastomeric pads containing thermally conductive ceramic particles (e.g., particles of boron nitride, aluminum oxide, or magnesium oxide). Plastic or metal clips anchored under the edges of grid array device packages or within sockets designed to receive pin grid array (PGA) device packages may be used to couple heat sinks to grid array device packages. When engaged, the clips apply pressure between grid array device packages and heat sinks. Alternately, metal hooks anchored in the PCB may be used to clamp heat sinks to grid array device packages. Such clips and hooks advantageously allow the heat sinks and device packages to be replaced separately. The applied pressure reduces the overall thickness of the thermal interface material while causing the thermal interface material to fill more of the air gaps, thus reducing $\theta_{CS}$. In general, the higher the pressure applied between the device package and the heat sink, the lower the value of $\theta_{CS}$. Heat sink clips and clamps are typically designed to apply a force of 10 pounds or less between grid array device packages and heat sinks.

Problems arise when the conventional thermal management techniques described above are applied to BGA device packages. A BGA device package has no socket in which to anchor heat sink fasteners (i.e., bolts or clips). As a result, heat sinks attached to BGA device packages are anchored either in the PCB or under edges of the BGA device package. Heat sink clamps anchored to the PCB are preferable to clips anchored under the edges of a BGA device package, especially when an electronic system including the BGA device package is expected to be subjected to mechanical shock and vibration (i.e., in portable applications).

It is noted that BGA device packages have no "case" as such, and the value of $\theta_{JA}$ for a BGA device package is given by:

$$\theta_{JA} = \theta_{JS} + \theta_{SA}$$

where $\theta_{JS}$ is the junction-to-sink thermal resistance value and $\theta_{SA}$ is the thermal resistance of the interface between the surface of the heat sink and the ambient (i.e., the sink-to-ambient thermal resistance value). The upper surface of a BGA device package is not, unfortunately, always parallel to the surface of the component side of the PCB to which the BGA device package is mounted. Manufacturing variations result in elevational disparity across the upper surface of the BGA device package as referenced from the component side of the PCB. In other words, the upper surface of the BGA device package is sloped or "tilted" in relation to the surface of the component side of the PCB, and in relation to the bottom surface of a heat sink anchored in the PCB. This slope or "tilt" between the bottom surface of the heat sink and the upper surface of the BGA device package is typically accommodated by a layer of a pliable thermal interface material at the expense of an increase in the value of $\theta_{JS}$. Achieving acceptably low values of $\theta_{JS}$ with a pliable thermal interface layer requires that a certain amount of pressure be continuously applied between the heat sink and the BGA device package. Reliability concerns due to movement of the solder balls over time (i.e., creep) limit the amount of pressure which may be applied between the heat sink and the BGA device package. The resulting reduced pressure further increases the value of $\theta_{JS}$. A conservative design approach requires a larger and more expensive cooling mechanism than would otherwise be necessary. The resulting increases in heat sink size and cost are highly undesirable, especially in portable applications.

A typical example involving a semiconductor device employing a ceramic BGA device package will now be described to illustrate the BGA device package thermal management problem. FIG. 1a is a side elevation view of a semiconductor device 10 employing a BGA device package mounted upon a component side of a PCB 12. Semiconductor device 10 includes one or more electronic devices formed upon a monolithic semiconductor substrate (i.e., chip) 14. Semiconductor device 10 also includes a substrate 16 substantially made of, for example, fiberglass-epoxy printed circuit board material or a ceramic material as described above. I/O pads on an underside of chip 14 are connected to corresponding members of a first set of bonding pads on an upper surface of substrate 16 using the well known controlled collapse chip connection (C4) method, commonly known as the "flip chip" method. The C4 connections are made in region 18 between chip 14 and substrate 16. After chip 14 is mounted upon substrate 16, region 18 is filled with an "underfill" material which seals the C4 connections and provides other mechanical advantages.

During PCB assembly, solder balls 20 formed upon a second set of bonding pads on an underside of substrate 16 are placed in physical contact with a corresponding set of bonding pads on the component side of PCB 12. Solder balls 20 may then be heated long enough for the solder to flow. Alternately, the bonding pads of PCB 12 may be coated with solder which melts at a lower temperature than that of solder balls 20, and the bonding pads of PCB 12 may be heated long enough for the solder thereupon to flow. In either case, when the solder cools, the second set of bonding pads of substrate 16 are electrically and mechanically coupled to the corresponding bonding pads of PCB 12.

Due to manufacturing variations, the elevations at opposite sides of chip 14 relative to the surface of the component side of PCB 12 (i.e., heights 22 and 24) may vary substantially. For a ceramic BGA package, the heights of solder balls 20 may vary about ±0.1 millimeter (mm). The thickness of substrate 16 may vary about ±10 percent (e.g., ±0.175 mm for a substrate 1.75 mm thick). The heights of C4 connections made in region 18 may vary by about ±0.016 mm, and the thickness if chip 14 may vary by about ±0.050 mm. Using a root-sum-of-squares combination of these tolerances, heights 22 and 24 may vary by, for example, about 0.2 mm. In addition, the upper surface of chip 14 is typically not parallel to the surface of the component side PCB 12, and slope 26 of the upper surface of chip 14 relative to the surface of PCB 12 may be, for example, as much as 0.006 inches of elevation per inch of distance parallel to the component side of PCB 12.

FIG. 1b will now be used to describe how the slope or "tilt" of the upper surface of chip 14 relative to the surface of PCB 12 is typically accommodated when a heat sink is employed to transfer heat energy produced by semiconductor device 10 to the ambient. FIG. 1b is a side elevation view of a heat sink 28 mounted upon semiconductor device 10 of FIG. 1a. Heat sink 28 includes two clips 30a–b anchored in PCB 12. Clips 30a–b apply pressure between heat sink 28 and semiconductor device 10 which urges heat sink 28 toward semiconductor device 10. A layer of a pliable thermal interface material 32 is positioned between an upper surface of chip 14 and a bottom surface of heat sink 28. Thermal interface layer 32 thermally couples heat sink 28 to chip 14. Thermal interface layer 32 is typically a piece of thermally conductive elastomer (e.g., thermal interface tape or a thermal interface pad).

Clips 30a–b continuously apply a substantially constant amount of pressure between heat sink 28 and semiconductor device 10 in order to achieve an acceptably low value of $\theta_{JS}$. This pressure is transmitted through chip 14 and substrate 16 to solder balls 20. Solder balls 20 are thus subjected to a substantially constant force, resulting in mechanical stress within solder balls 20. During operation of chip 14, solder balls 20 are subjected to sufficient heat energy that a phenomenon called "creep" occurs. Mechanical creep is the permanent deformation of a material subjected to stress and temperatures greater than about one-third the melting temperature of the material. As a result of creep, solder balls 20 may cease to form low-resistance electrical connections between the bonding pads on the underside of substrate 16 and the corresponding set of bonding pads on the component side of PCB 12. The constant pressure applied between heat sink 28 and semiconductor device 10 by clips 30a–b thus represents a long term reliability concern. In addition, the pressure exerted between heat sink 28 and semiconductor device 10 across thermal interface layer 32 is not uniform. As a result, the achieved value of $\theta_{JS}$ is typically greater than expected. A conservative design approach requires that a larger and more expensive heat sink with a lower value of $\theta_{SA}$ be installed to compensate for the increase in $\theta_{JS}$.

It would be beneficial to have a semiconductor device heat transfer apparatus which: (i) is capable of operating when the semiconductor device is expected to be subjected to mechanical shock and vibration (i.e., in portable applications), (ii) does not adversely affect system reliability, and (iii) is relatively small and inexpensive. In order to isolate the semiconductor device from shock and vibration, a heat transfer apparatus is desirable which employs a thermally conductive cap structure which is thermally coupled to the semiconductor device but mechanically isolated from the semiconductor device. The cap structure would be positioned between an upper surface of the semiconductor device and the ambient. In order to prevent an adverse impact on system reliability, a heat transfer apparatus is desirable which uses a thermal interface layer which requires little or no pressure between the cap structure and the upper surface of the semiconductor device in order to achieve an acceptably low value of $\theta_{JS}$. The use of little or no pressure would allow the heat transfer apparatus to accommodate any elevational disparity between the upper surface of the semiconductor device and a surface of the PCB without creating a significant amount of mechanical stress within the electrical connections between the semiconductor device package and the PCB (e.g., solder balls of a BGA device package). The ability to achieve an acceptably low value of $\theta_{JS}$ would allow the heat transfer apparatus to be relatively small and inexpensive.

SUMMARY OF THE INVENTION

The problems outlined above are in large part solved by a heat transfer apparatus which accommodates elevational disparity of an upper surface of a surface-mounted semiconductor device relative to a component side of a printed circuit board (PCB) without adversely affecting system reliability. Surface-mounted semiconductor devices are mounted upon component sides of PCBs. Due to manufacturing variations, the elevations of upper surfaces of such semiconductor devices may vary relative to the component sides of the PCBs. In addition, the upper surfaces may slope or "tilt" with respect to the component sides of the PCBs. The heat transfer apparatus of the present invention is used to transfer heat energy from the semiconductor device to an ambient surrounding the heat transfer apparatus. The heat transfer apparatus reduces the effects of any such elevational disparity on the thermal resistances of heat transfer paths formed between the semiconductor device and the ambient.

The heat transfer apparatus includes a thermally conductive cap structure positioned between the semiconductor device and an ambient and used to transfer heat energy produced by the semiconductor device to the ambient. A thermal interface layer is used to thermally couple the cap structure to the semiconductor device. The thermal interface layer requires a relatively small amount of pressure between the cap structure and the upper surface of the semiconductor device in order to achieve an acceptably low value of thermal resistance between the semiconductor device and the cap structure (i.e., $\theta_{JS}$).

In a first embodiment, one or more spacers are used to maintain a desired distance (i.e., a space) between the cap structure and the semiconductor device package. During installation of the heat transfer apparatus, a force is used to bias the cap structure toward the semiconductor device, and the position of the cap structure relative to the semiconductor device is fixed such that the space formed between the cap structure and the semiconductor device is maintained during use. The semiconductor device package may include, for example, solder balls on an underside surface. The solder balls are subjected to a portion of the force during installation resulting in mechanical stress within the solder balls. Once the position of the cap structure is permanently fixed relative to the semiconductor device, the solder balls undergo a process known as "stress relaxation". The term "stress relaxation" as used herein describes the reduction of stress in viscoplastic materials (e.g., solder) with time when the materials are in a state of plastic (i.e., permanent) deformation. Fixing the position of the cap structure relative to the semiconductor device promotes stress relaxation within the solder balls. As a result of this stress relaxation, the problem of creep-related solder ball failure is substantially reduced, and overall system reliability is increased.

The cap structure preferably has a bottom surface with a hollowed out area (i.e., a cavity) sized to enclose the semiconductor device. The cavity may also be sized to enclose the semiconductor device along with any decoupling capacitors associated with the semiconductor device. A substantially flat ceiling (i.e., upper wall) of the cavity is in close proximity to the semiconductor device during use. The spacers are positioned between an upper surface of the semiconductor device and the upper wall of the cavity. Each spacer is in contact with both the semiconductor device and the upper wall of the cavity during use. The spacers allow the upper wall of the cavity to come within close proximity of the semiconductor device under the force used to bias the cap structure toward the semiconductor device, but do not allow the upper wall of the cavity to come in contact with the semiconductor device. When the semiconductor device employs a BGA device package, the spacers are distributed about the periphery of the substrate. The spacers simultaneously achieve mechanical isolation of the chip from the cap structure and a highly predictable value of $\theta_{JS}$. Mechanical isolation of the chip from the cap structure prevents damage to the chip due to vibration and shock.

Possible shapes of the spacers include spherical, cylindrical, and conical shapes. When multiple spacers are used, they are most effective when dispersed about the periphery of the semiconductor device. The spacers are preferably made of a thermally conductive material to aid in the transfer of heat from the semiconductor device to the cap structure. The spacers may also be made of a viscoplastic material, such as, for example, solder. Such viscoplastic spacers further reduce the problem of creep-related solder ball failure in BGA device packages.

The heat transfer apparatus also preferably includes a backing plate positioned on a side of the PCB opposite the component side and at a location opposite that of the semiconductor device during use. The backing plate provides structural support for the PCB, preventing the PCB from bowing under pressure resulting from the force used to bias the cap structure toward the semiconductor device during installation. The backing plate is preferably made of a thermally conductive material (e.g., aluminum) and thermally coupled to the PCB in order to allow the backing plate to provide an additional heat transfer path from the semiconductor device to the ambient.

Several fasteners are preferably used to attach the backing plate to the cap structure. A portion of the fasteners are used to exert a force between the cap structure and the backing plate, urging the cap structure toward the semiconductor device during installation. The remaining fasteners are used to fix the relative positions of the backing plate and the cap structure.

The heat transfer apparatus includes a first thermal interface layer used to thermally couple the cap structure to the semiconductor device during use. The first thermal interface layer is positioned between the semiconductor device and the cap structure during installation of the heat transfer apparatus about the semiconductor device. The first thermal interface layer is made of a material selected to achieve an acceptable value of $\theta_{JS}$ with a relatively small amount of pressure applied between the cap structure and the semiconductor device. The first thermal interface layer preferably includes thermally conductive particles suspended in a wax base.

The heat transfer apparatus also preferably includes a second thermal interface layer used to thermally couple the backing plate to the PCB. The second thermal interface layer is positioned between the backing plate and the PCB structure during installation of the heat transfer apparatus about the semiconductor device.

The heat transfer apparatus also preferably includes a seal positioned between a lip surrounding the mouth of the cavity and the PCB. The seal is used to prevent foreign substances (e.g., water, sand, and dust) from entering the cavity during use, and is preferably made of an elastomeric compound.

In an alternate embodiment of the heat transfer apparatus, the first thermal interface layer has properties which make the one or more spacers unnecessary. The spacers are omitted in cases where the first thermal interface layer has: (i) a uniform thickness approximately equal to the desired spacing between the semiconductor device and the cap structure, and (ii) a consistency such that the thickness is substantially maintained during installation.

BRIEF DESCRIPTION OF THE DRAWINGS

Other objects and advantages of the invention will become apparent upon reading the following detailed description and upon reference to the accompanying drawings in which.

Figure 1A:
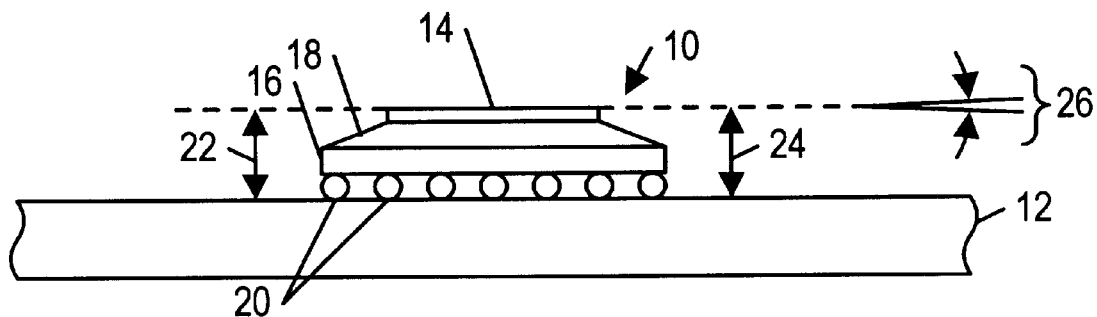
FIG. 1a is a side elevation view of a semiconductor device employing a BGA device package and mounted upon a component side of a printed circuit board (PCB), according to a prior art design.
Figure 1B:
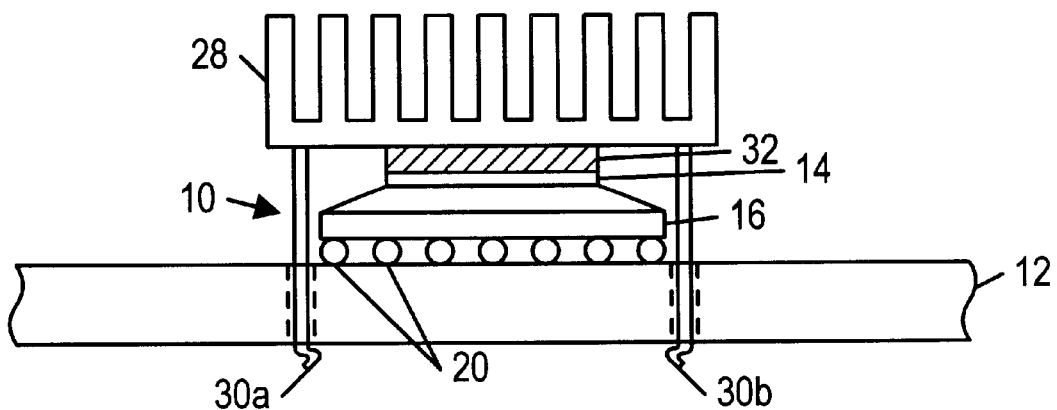
FIG. 1b is a side elevation view of a heat sink mounted upon the semiconductor device of FIG. 1a, according to a prior art design.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Figure 2:
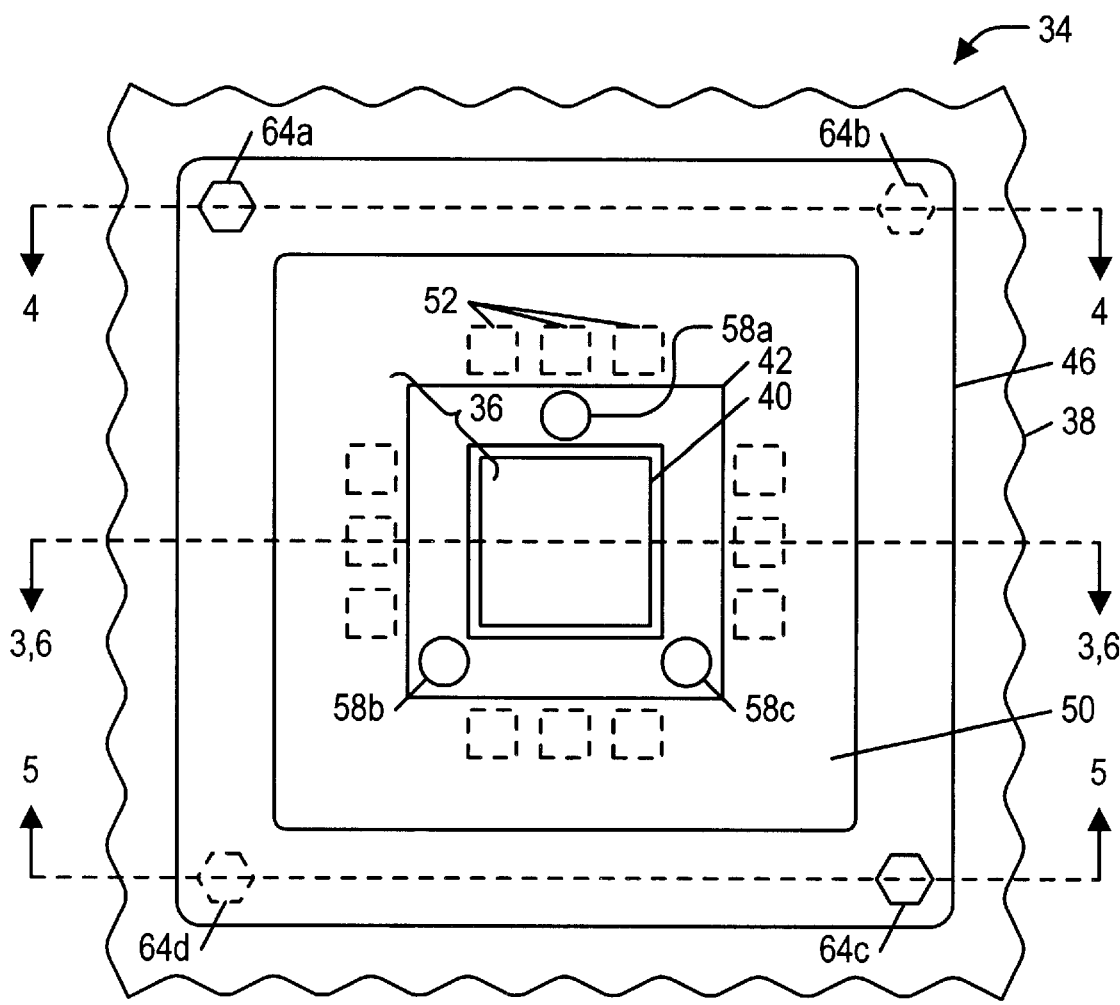
FIG. 2 is a top plan view of a first embodiment of a heat transfer apparatus of the present invention, wherein the heat transfer device includes a cap structure thermally coupled to a semiconductor device, and wherein four bolts attach the cap structure to a backing plate.
Figure 3:
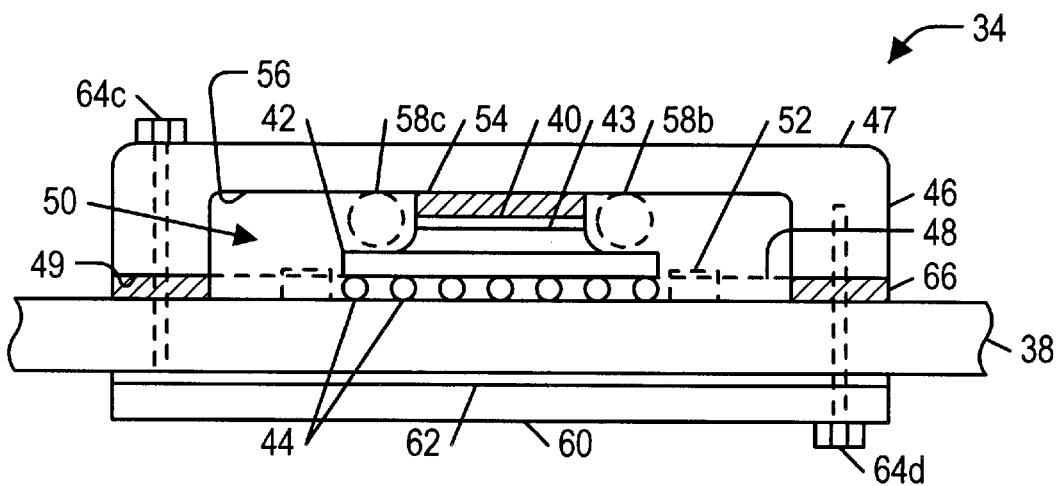
FIG. 3 is a cross-sectional view of the heat transfer apparatus of FIG. 2 as viewed in the direction indicated in FIG. 2.

FIGS. 2 and 3 will now be used to describe a first embodiment of a heat transfer apparatus 34 of the present invention. FIG. 2 is a top plan view of heat transfer apparatus 34, and FIG. 3 is a cross-sectional view heat transfer apparatus 34 as viewed in the direction indicated in FIG. 2. Heat transfer apparatus 34 is designed to transfer heat energy produced by semiconductor device 36 to an ambient surrounding heat transfer apparatus 34. Semiconductor device 36 is mounted upon a component side of a printed circuit board (PCB) 38. In the embodiment shown, semiconductor device 36 employs a BGA device package, and includes a chip 40 mounted upon a substantially flat upper surface of substrate 42. Chip 40 is a monolithic semiconductor substrate having one or more electronic devices formed thereon. Substrate 42 is preferably substantially made of a ceramic material (e.g., aluminum oxide, alumina, $Al_2O_3$, or aluminum nitride, AlN). Alternately, substrate 42 may be a printed circuit board made of, for example, fiberglass-epoxy printed circuit board material. Substrate 42 includes one or more layers of signal lines (i.e., interconnects) which couple a first set of bonding pads on the upper surface of substrate 42 to a second set of bonding pads on an underside surface of substrate 42. I/O pads on an underside surface of chip 40 are connected to corresponding members of the first set of bonding pads of substrate 16 using the well known controlled collapse chip connection (C4) method, commonly known as the "flip chip" method, in a region 43. Chip 40 is mounted upon a central portion of the upper surface of substrate 42 as shown. After chip 40 is mounted upon substrate 42, region 43 is filled with an "underfill" material which seals the C4 connections and provides other mechanical advantages. Solder balls 44 formed upon the second set of bonding pads of substrate 42 are used to connect the second set of bonding pads to corresponding bonding pads on the component side of PCB 38 during a solder reflow operation.

Heat transfer apparatus 34 includes a cap structure 46 which is positioned between semiconductor device 36 and the ambient during use. Cap structure 46 is made out of a thermally conductive material (e.g., aluminum). Cap structure 46 includes a top surface 47 and a bottom surface 48. Bottom surface 48 has a cavity 50 sized to receive semiconductor device 36. As shown, cavity 50 may also be sized to receive semiconductor device 36 along with any decoupling capacitors 52 associated with semiconductor device 36. During use of heat transfer apparatus 34, semiconductor device 36 is positioned within cavity 50 as shown.

Chip 40 of semiconductor device 36 has a substantially flat upper surface, and cavity 50 of cap structure 46 has a substantially flat upper wall 56. A first thermal interface layer 54 is positioned between the upper surface of chip 40 and upper wall 56 of cavity 50 during use, thermally coupling chip 40 to cap structure 46. First thermal interface layer 54 is preferably made of a material which changes phase (i.e., flows) to fill air pockets between the upper surface of chip 40 and upper wall 56, and to fill microscopic irregularities in the upper surface of chip 40 and the surface of upper wall 56, under a relatively small amount of pressure applied between cap structure 46 and chip 40 during installation. First thermal interface layer 54 thus achieves an acceptable value of thermal resistance between the upper surface of chip 40 and the surface of upper wall 56 (i.e., $\theta_{JS}$) during use.

First thermal interface layer 54 may be, for example, a layer of thermal grease or thermal wax. Thermal greases contain particles of thermally conductive material (e.g., ceramic particles) suspended in a viscous silicone or hydrocarbon fluid base. Thermal waxes contain thermally conductive particles suspended in a wax base. A suitable thermal wax is the THERMFLOW™ T705 thermal wax (Chomerics Co., Woburn, Mass.). Alternately, first thermal interface layer 54 may be a piece of thermal interface tape or a thermal interface pad which changes phase to fill air pockets and microscopic irregularities under a relatively small amount of pressure. A suitable thermal interface tape is the THERMATTACH™ T412 thermal interface tape (Chomerics Co., Woburn, Mass.).

In the embodiment of FIGS. 2 and 3, three spacers 58a–c are dispersed about the periphery of the upper surface of substrate 42 surrounding the central region of substrate 42 in which chip 40 is mounted. Spacers 58a–c are dimensioned to maintain a desired spacing between the upper surface of chip 40 of semiconductor device 36 and the upper wall 56 of cavity 50 of cap structure 46 during use. Spacers 58a–c thus allow cap structure 46 to come within close proximity of the upper surface of chip 40 without contacting the upper surface of chip 40. This arrangement mechanically isolates chip 40 from the cap structure 46 during use, preventing damage to chip 40 due to shock and vibration. In alternate embodiments, one or more spacers 58 may be employed, and the spacers may have alternate shapes including cylindrical and conical (see FIGS. 4 and 5).

Each spacer 58 contacts the upper surface of substrate 42 and the upper wall of cavity 50, and is preferably dimensioned to ensure the plane defined by the substantially flat upper wall 56 of cavity 50 is substantially parallel the plane defined by the substantially flat upper surface of substrate 42. As the upper surface of chip 40 is substantially parallel to the upper surface of substrate 42, the upper wall 56 of cavity 50 is also substantially parallel to the plane defined by the upper surface of chip 40. Spacers 58a–c maintain upper wall 56 at a desired distance from the upper surface of chip 40 during installation and use, simultaneously achieving mechanical isolation of chip 40 from cap structure 46 and a highly predictable value of $\theta_{JS}$.

In the embodiment of FIGS. 2 and 3, heat transfer apparatus 34 also includes a backing plate 60 and a second thermal interface layer 62. During use of heat transfer apparatus 34, backing plate 60 and second thermal interface layer 62 are positioned against a side of PCB 38 opposite the component side as shown in FIG. 3. Four bolts 64a–d attach cap structure 46 to backing plate 60 through corresponding holes in PCB 38. When tightened, two of the four bolts, bolts 64a and 64c, exert forces which draw cap structure 46 and backing plate 60 together and urge cap structure 46 toward the upper surface of chip 40. The other two bolts, bolts 64b and 64d, are installed after bolts 64a and 64c and interlock cap structure 46 and backing plate 60. This interlocking function locks in the achieved spacing between upper wall 56 of cavity 50 of cap structure 46 and the upper surface of substrate 42 of semiconductor device 36.

Second thermal interface layer 62 thermally couples backing plate 60 to PCB 38. Second thermal interface layer 62 is preferably patterned from a sheet of an elastomeric material containing particles of a thermally conductive material (e.g., ceramic particles). Suitable material for second thermal interface layer 62 includes the CHO-THERM® T412 thermal interface tape (Chomerics Co., Woburn, Mass.). Alternately, second thermal interface layer 62 may be a layer of thermal grease or thermal wax.

The tightening of bolts 64a and 64c causes cap structure 46 to apply pressure upon semiconductor device 36 via first thermal interface layer 54 and spacers 58a–c. Semiconductor device 36 in turn applies pressure to PCB 38, causing PCB 38 to bow. Backing plate provides structural support for PCB 38, preventing PCB 38 from bowing under the pressure applied by semiconductor device 36. Backing plate 60 is made of a thermally conductive material (e.g., aluminum), and provides an additional heat transfer path from semiconductor device 36 to the ambient. In the additional heat transfer path, heat energy produced by semiconductor device 36 flows through PCB 38, second thermal interface layer 62, and backing plate 60 to the ambient.

In the embodiment of FIGS. 2 and 3, heat transfer apparatus 34 also includes a seal 66 positioned between a lip 49 in bottom surface 48 of cap structure 46, formed around the mouth of cavity 50, and the adjoining portion of the components side of PCB 38 during use. Seal 66 substantially prevents foreign substances (e.g., water, sand, and dust) from entering cavity 50.

Figure 4:
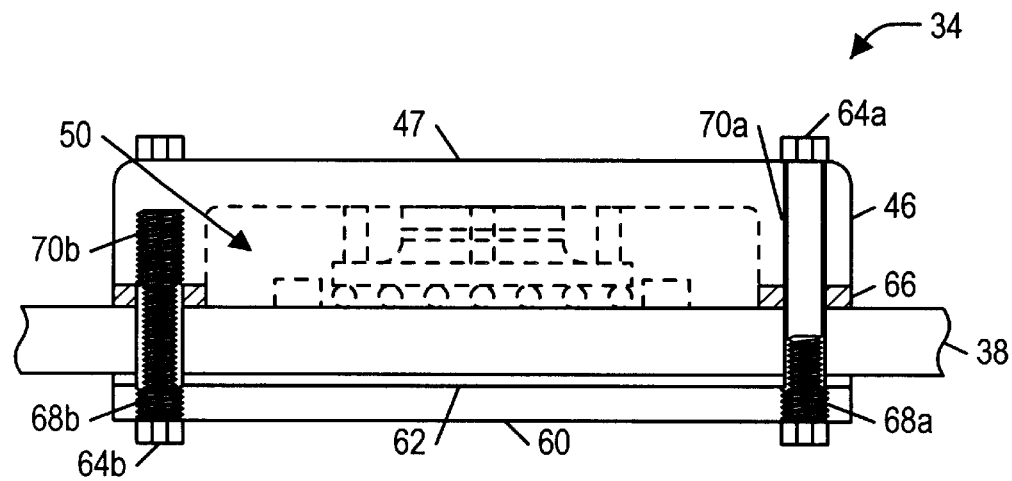
FIG. 4 is a cross-sectional view of the heat transfer apparatus of FIG. 2 as viewed in the direction indicated in FIG. 2, wherein two of the four bolts which attach the cap structure to the backing plate are shown, and wherein one of the two bolts shown is used to generate a force which urges the cap structure toward the semiconductor device, and wherein the other bolt shown is used to lock in an achieved spacing between the cap structure and the semiconductor device.
Figure 5:
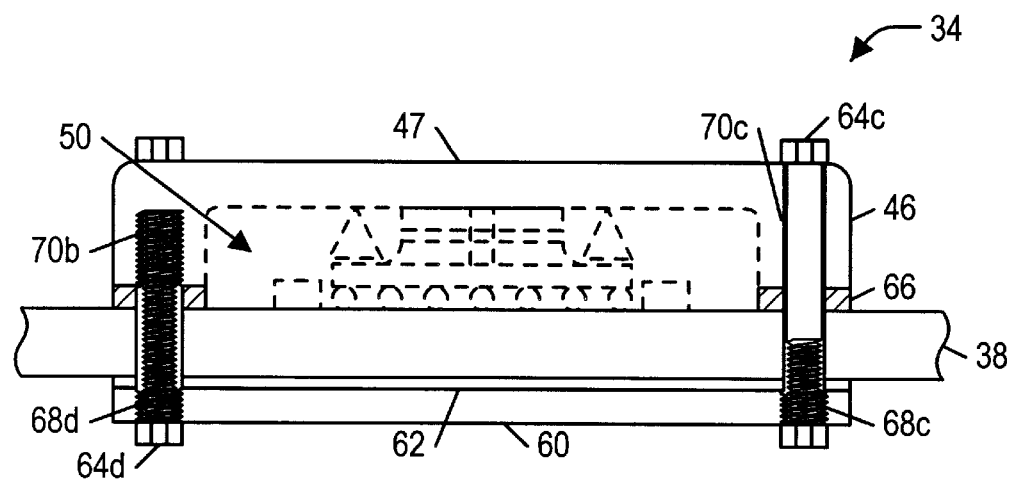
FIG. 5 is a cross-sectional view of the heat transfer apparatus of FIG. 2 as viewed in the direction indicated in FIG. 2, wherein two of the four bolts which attach the cap structure to the backing plate are shown, wherein one of the two bolts shown is used to generate a force which urges the cap structure toward the semiconductor device, and wherein the other bolt shown is used to lock in an achieved spacing between the cap structure and the semiconductor device.

FIGS. 4 and 5 will now be used to further describe the components of heat transfer apparatus 34 and the installation of heat transfer apparatus 34 about semiconductor device 36. FIGS. 4 and 5 are cross-sectional views of heat transfer apparatus 34 as viewed, respectively, in the directions indicated in FIG. 2. As indicated in FIG. 4, backing plate 60 includes two holes 68a and 68b threaded to receive bolts 64a and 64b, respectively. Cap structure 46 includes two holes 70a and 70b. Hole 70a is a clearance hole having smooth sides to allow bolt 64a to pass through cap structure 46, while hole 70b is threaded to receive bolt 64b. As shown in FIG. 5, backing plate 60 also includes two holes 68c and 68d threaded to receive bolts 64c and 64d, respectively. Cap structure 46 also includes two holes 70c and 70d. Hole 70c is a clearance hole having smooth sides to allow bolt 64c to pass through cap structure 46, while hole 70d is threaded to receive bolt 64d.

During installation of heat transfer apparatus 34, first thermal interface layer 54 is formed upon upper wall 56 of cavity 50 of cap structure 46 in the location expected to adjoin the upper surface of chip 40 of semiconductor device 36. Alternately, first thermal interface layer 54 may be formed upon the upper surface of chip 40 of semiconductor device 36. Spacers 58a–c are dispersed about the periphery of the upper surface of substrate 42 and firmly attached to the upper surface of substrate 42 using, for example, an epoxy adhesive. Cap structure 46 and seal 66 are positioned about semiconductor device 36 from the component side of PCB 38 as shown in FIGS. 1–5, and second thermal interface layer 62 and backing plate 60 are positioned about semiconductor device 36 from the side of PCB 38 opposite the component side. Bolts 64a and 64c are inserted into holes 70a and 70c, respectively, through top surface 47 of cap structure 46. Bolts 64a and 64c are then threaded into holes 68a and 68c, respectively, and tightened. Bolts 64b and 64d are threaded into holes 70b and 70d, respectively, in backing plate 60. The threading of bolts 64b and 64d is continued until bolts 64b and 64d extend into holes 70b and 70d, respectively, in cap structure 46. Bolts 64b and 64d are then tightened. Installed in this manner, bolts 64a and 64c exert a force which draws cap structure 46 and backing plate 60 together and urges cap structure 46 toward the upper surface of chip 40. Bolts 64b and 64d, on the other hand, serve to interlock cap structure 46 and backing plate 60. This interlocking function locks in the achieved spacing between upper wall 56 of cavity 50 of cap structure 46 and the upper surface of substrate 42 of semiconductor device 36.

In an alternate embodiment of heat transfer apparatus 34, first thermal interface layer 54 has properties which make spacers 58a–c unnecessary. Spacers 58a–c are omitted in cases where the material used to form first thermal interface layer 54 is applied in a substantially uniform thickness approximately equal to the desired spacing between semiconductor device 36 and cap structure 46, and the consistency of the material used to form first thermal interface layer 54 is such that the thickness is substantially maintained during installation. Some thermal greases, thermal waxes, and thermal elastomeric materials possess such properties.

Some thermal greases are very viscous at room (i.e., installation) temperature and have substantially reduced viscosities at typical semiconductor device operating temperatures (e.g., 60–80° C.). During installation, the thicknesses of such greases are maintained by their consistencies before the position of the cap structure 46 is fixed relative to semiconductor device 36 via the bolts. Subsequent heating of the thermal grease during operation of semiconductor device 36 allows the thermal grease to flow, eliminating any pressure applied to the upper surface of semiconductor device 36 by cap structure 46. Thermal waxes are typically solid at room temperature, and become liquid (i.e., change phase or flow) at temperatures between about 40–60° C. After flowing, any pressure applied to the upper surface of semiconductor device 36 by cap structure 46 is eliminated. A suitable thermal wax is the THERMFLOW™ T705 thermal wax (Chomerics Co., Woburn, Mass.).

Figure 6:
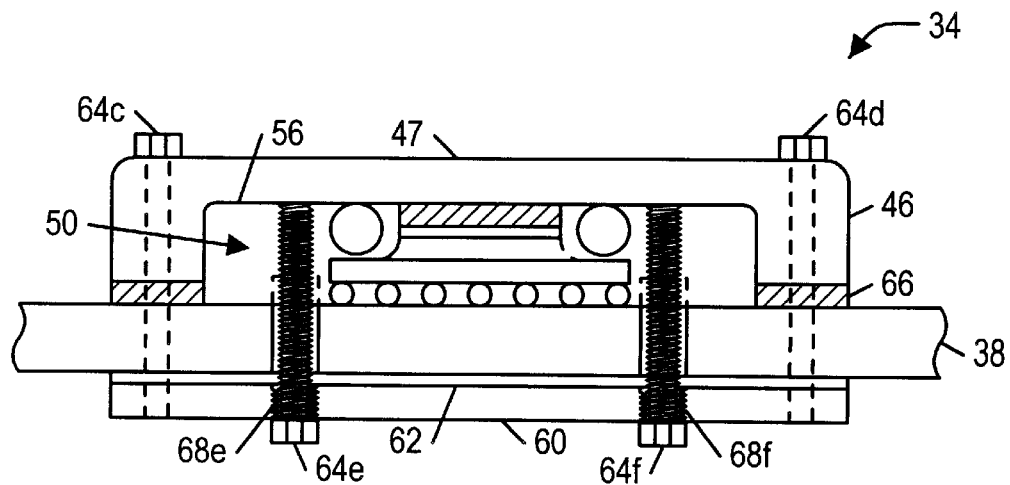
FIG. 6 is a cross-sectional view of an alternate embodiment of the heat transfer apparatus as viewed in the direction indicated in FIG. 2, wherein two additional bolts positioned near the semiconductor device are used to lock in an achieved spacing between the cap structure and the semiconductor device.

FIG. 6 will now be used to describe an alternate embodiment of heat transfer apparatus 34 in which two additional bolts are used to lock in the achieved spacing between upper wall 56 of cavity 50 of cap structure 46 and the upper surface of substrate 42 of semiconductor device 36. FIG. 6 is a cross-sectional view of the alternate embodiment of heat transfer apparatus 34 as viewed in the direction indicated in FIG. 2. In the alternate embodiment, heat transfer apparatus 34 includes two additional bolts 64e and 64f, and backing plate 60 includes two additional holes 68e and 68f threaded to receive bolts 64e and 64f, respectively. Holes 70a–d of cap structure 46 have smooth sides to allow bolts 64a–d to pass through cap structure 46. During installation of heat transfer apparatus 34, bolts 64a–d are inserted into holes 70a–d, respectively, through top surface 47 of cap structure 46. Bolts 64a–d are then threaded into holes 68a–d, respectively, and tightened. Following the tightening of bolts 64a–d, bolts 64e and 64f are threaded into holes 68e and 68f, respectively, of backing plate 60. Bolts 64e and 64f are then tightened until the threaded ends of bolts 64e and 64f just contact upper wall 56 of cavity 50. Installed in this manner, bolts 64a–d exert forces which draw cap structure 46 and backing plate 60 together and urge cap structure 46 toward the upper surface of chip 40, and bolts 64a–f work together to interlock cap structure 46 and backing plate 60. This interlocking function locks in the achieved spacing between upper wall 56 of cavity 50 of cap structure 46 and the upper surface of substrate 42 of semiconductor device 36. In addition, bolts 64e and 64f limit the bowing of upper wall 56 toward the upper surface of chip 40 under shock loading. This alternate embodiment is thus beneficial when cap structure 46 is relatively large and upper wall 56 may bow significantly under shock loading.

It is noted that alternate embodiments may use other types of fasteners in place of bolts 64a–d such as, for example, screws, clips, clamps, or rivets. It is also noted that bolts 64e–f may be screws. It is also noted that alternate embodiments may use two or more such fasteners to attach backing plate 60 to cap structure 46 and generate a force which urges cap structure 46 toward semiconductor device 36. Alternate embodiments may also omit backing plate 60, second thermal interface layer 62, and bolts 64a–d, and use an adhesive to attach cap structure 46 to the component side of PCB 38, simultaneously forming seal 66.

It is also noted that the heat transfer apparatus of the present invention may also be advantageously employed with other types of surface-mount device packages, including, for example, small outline packages and quad flatpacks, in order to reduce reliability concerns regarding creep.

It will be appreciated by those skilled in the art having the benefit of this disclosure that this invention is believed to be a heat transfer apparatus which accommodates elevational disparity of an upper surface of a surface-mounted semiconductor device with respect to the component side of a PCB to which the device is mounted without adversely affecting system reliability. Furthermore, it is also to be understood that the form of the invention shown and described is to be taken as exemplary, presently preferred embodiments. Various modifications and changes may be made without departing from the spirit and scope of the invention as set forth in the claims. It is intended that the following claims be interpreted to embrace all such modifications and changes.

What is claimed is:

1. A heat transfer apparatus transferring heat energy from a chip mounted to a substrate, the heat transfer apparatus comprising:

a thermally conductive cap structure;

at least one spacer engaged between respective surfaces of the cap structure and a region of the substrate laterally outside a perimeter of the chip such that a space is formed between the cap structure and the chip;

wherein a force is used to bias the cap structure toward the chip; and wherein the position of the cap structure relative to the chip is fixed such that the space formed between the cap structure and the chip is maintained.

2. The heat transfer apparatus as recited in claim 1, further comprising a plurality of fasteners, wherein during installation a portion of the plurality of fasteners are used to create the force and the remainder of the plurality of fasteners are used to fix the position of the cap structure relative to the chip.

3. The heat transfer apparatus as recited in claim 2, wherein the plurality of fasteners comprise bolts.

4. The heat transfer apparatus as recited in claim 1, wherein the substrate has a plurality of solder balls arranged upon an underside surface, and wherein at least one of the plurality of solder balls is attached to a printed circuit board.

5. The heat transfer apparatus as recited in claim 4, wherein during installation the force causes mechanical stress within the at least one of the plurality of solder balls, and wherein following installation the at least one of the plurality of solder balls undergoes mechanical stress relaxation.

6. The heat transfer apparatus as recited in claim 1, wherein the at least one spacer is spherical in shape and comprises a thermally conductive material.

7. The heat transfer apparatus as recited in claim 6, wherein the at least one spacer comprises a viscoplastic material, and wherein during installation the force causes mechanical stress within the at least one spacer, and wherein following installation the at least one spacer undergoes mechanical stress relaxation.

8. The heat transfer apparatus as recited in claim 7, wherein the at least one spacer comprises solder.

9. The heat transfer apparatus as recited in claim 2, wherein the substrate has a substantially flat upper surface comprising a first and second regions, and wherein the chip is mounted to the upper surface of the substrate within the first region.

10. The heat transfer apparatus as recited in claim 9, wherein the cap structure comprises a substantially flat surface, and wherein a plurality of spacers are interposed between and in contact with the second region of the upper surface of the substrate and the substantially flat surface of the cap structure, and wherein each of the plurality of spacers is dimensioned such that the substantially flat surface of the cap structure is substantially parallel to the upper surface of the substrate.

11. The heat transfer apparatus as recited in claim 10, wherein each of the plurality of spacers is spherical in shape and comprises a thermally conductive material.

12. A heat transfer apparatus transferring heat energy from a semiconductor device to an ambient, wherein the semiconductor device comprises an upper surface having a chip attached thereto, and wherein the semiconductor device is mounted upon a component side of a printed circuit board (PCB), the heat transfer apparatus comprising:

a thermally conductive cap structure, wherein the cap structure is interposed between the semiconductor device and the ambient, and wherein the cap structure is in thermal communication with the semiconductor device;

at least one spacer, wherein the at least one spacer is interposed between and in contact with a portion of the upper surface of the semiconductor device surrounding the chip and the cap structure such that a space is formed between the upper surface of the chip and the cap structure;

a backing plate positioned on a side of the PCB opposite the component side and at a location opposite that of the semiconductor device;

a plurality of fasteners for attaching the backing plate to the cap structure; and wherein the at least one spacer is spherical in shape and comprises a thermally conductive material.

13. The heat transfer apparatus as recited in claim 12, wherein during installation a portion of the plurality of fasteners are used to create a force between the backing plate and the cap structure which urges the cap structure toward the semiconductor device, and wherein the remainder of the plurality of fasteners are used to fix the relative positions of the backing plate and the cap structure.

14. The heat transfer apparatus as recited in claim 13, wherein the semiconductor device further comprises an underside surface, and wherein a plurality of solder balls are arranged upon the underside surface, and wherein at least one of the plurality of solder balls is attached to the PCB.

15. The heat transfer apparatus as recited in claim 14, wherein during installation the force causes mechanical stress within the at least one of the plurality of solder balls, and wherein following installation the at least one of the plurality of solder balls undergoes mechanical stress relaxation.

16. The heat transfer apparatus as recited in claim 12, wherein the at least one spacer comprises a viscoplastic material, and wherein during installation the force causes mechanical stress within the at least one spacer, and wherein following installation the at least one spacer undergoes mechanical stress relaxation.

17. The heat transfer apparatus as recited in claim 16, wherein the at least one spacer comprises solder.

18. A heat transfer apparatus transferring heat energy from a semiconductor device to an ambient, wherein the semiconductor device comprises an upper surface, and wherein the semiconductor device is mounted upon a component side of a printed circuit board (PCB), the heat transfer apparatus comprising:

a thermally conductive cap structure comprising a bottom surface having a cavity and a circumferential lip surrounding the cavity, and wherein the cavity comprises an upper wall, and wherein the semiconductor device resides within the cavity and the cap structure is interposed between the semiconductor device and the ambient;

at least one spacer interposed between and in contact with the upper surface of the semiconductor device and the upper wall of the cavity such that a space is formed between the upper surface of the semiconductor device and the upper wall of the cavity;

a backing plate positioned on a side of the PCB opposite the component side and at a location opposite that of the semiconductor device;

a plurality of fasteners for attaching the backing plate to the cap structure;

a first thermal interface layer interposed between the semiconductor device and the cap structure and thermally couples the cap structure to the semiconductor device;

a second thermal interface layer interposed between the backing plate and the PCB and thermally couples the backing plate to the PCB; and a seal interposed between the lip of the cap structure and the PCB.

19. The heat transfer apparatus as recited in claim 18, wherein during installation a portion of the plurality of fasteners are used to create a force between the backing plate and the cap structure which urges the cap structure toward the semiconductor device, and wherein the remainder of the plurality of fasteners are used to fix the relative positions of the backing plate and the cap structure.

20. The heat transfer apparatus as recited in claim 18, wherein the at least one spacer is spherical in shape and comprises a thermally conductive material.

21. The heat transfer apparatus as recited in claim 18, wherein the first thermal interface layer comprises a plurality of thermally conductive particles suspended in a wax base.

22. The heat transfer apparatus as recited in claim 18, wherein the backing plate comprises a thermally conductive material.

23. The heat transfer apparatus as recited in claim 18, wherein the second thermal interface layer comprises a plurality of thermally conductive particles within an elastomeric compound.

24. The heat transfer apparatus as recited in claim 18, wherein the seal comprises an elastomeric compound.

25. The heat transfer apparatus as recited in claim 18, wherein the semiconductor device comprises a substrate and a chip, and wherein the substrate has a substantially flat upper surface comprising a first and second regions, and wherein the chip is mounted to the upper surface of the substrate within the first region.

26. The heat transfer apparatus as recited in claim 25, wherein the cap structure comprises a substantially flat surface, and wherein a plurality of spacers are interposed between and in contact with the second region of the upper surface of the substrate and the substantially flat surface of the cap structure, and wherein each of the plurality of spacers is dimensioned such that the substantially flat surface of the cap structure is substantially parallel to the upper surface of the substrate.

27. The heat transfer apparatus as recited in claim 26, wherein each of the plurality of spacers is spherical in shape and comprises a thermally conductive material.

28. A heat transfer apparatus for transferring heat energy from an integrated circuit to an ambient, comprising:

a substrate having a surface on which the integrated circuit is bonded to only a first portion of said surface;

a thermally conductive cap in thermal communication with the integrated circuit and the ambient;

at least one spacer configured outside the perimeter of the integrated circuit and biased between the substrate and the thermally conductive cap such that a space is formed between the integrated circuit and the cap; and a printed circuit board (PCB) bonded to an underside surface of the substrate, wherein the underside surface is opposite the surface on which the integrated circuit is bonded.

29. The heat transfer apparatus as recited in claim 28, wherein the integrated circuit is not bonded to a second portion such that said spacer is configured between the second portion and the thermally conductive cap.

30. The heat transfer apparatus as recited in claim 28, wherein said thermally conductive cap comprises an upper surface and a lower surface, said upper surface is in thermal communication with the ambient and said lower surface receives said spacer.

31. The heat transfer apparatus as recited in claim 28, wherein the PCB is secured between a backing plate and the thermally conductive cap by a plurality of fasteners placed outside the perimeter of said integrated circuit and said substrate.

32. The heat transfer apparatus as recited in claim 31, wherein during installation a portion of the plurality of fasteners are used to create a force between the backing plate and the thermally conductive cap which urges the thermally conductive cap toward the integrated circuit, and wherein the remainder of the plurality of fasteners are used to fix the relative positions of the backing plate and the thermally conductive cap.

33. The heat transfer apparatus as recited in claim 32, wherein a plurality of solder balls are arranged upon the underside surface, and wherein at least one of the plurality of solder balls is attached to the PCB.

34. The heat transfer apparatus as recited in claim 33, wherein during installation the force causes mechanical stress within the at least one of the plurality of solder balls, and wherein following installation the at least one of the plurality of solder balls undergoes mechanical stress relaxation.

* * * * *